United States Patent
He et al.

(10) Patent No.: US 11,317,536 B2
(45) Date of Patent: Apr. 26, 2022

(54) HIGH-EFFICIENCY PHASE-CHANGE CONDENSER OF A SUPERCOMPUTER

(71) Applicant: SUGON DATAENERGY(BEIJING) CO., LTD, Beijing (CN)

(72) Inventors: Jisheng He, Beijing (CN); Xintao Cui, Beijing (CN); Lei Han, Beijing (CN); Bingshuang Li, Beijing (CN); Jiawei Liu, Beijing (CN); Yingjun Wu, Beijing (CN); Shuai Zhang, Beijing (CN); Zhihong Zhao, Beijing (CN); Chen Wang, Beijing (CN); Hongjie Wu, Beijing (CN); Peng Zhang, Beijing (CN)

(73) Assignee: SUGON DATAENERGY(BEIJING) CO., LTD, Beijing (CN)

( * ) Notice: Subject to any disclaimer, the term of this patent is extended or adjusted under 35 U.S.C. 154(b) by 0 days.

(21) Appl. No.: 16/955,263

(22) PCT Filed: Dec. 26, 2017

(86) PCT No.: PCT/CN2017/118553
§ 371 (c)(1),
(2) Date: Jun. 18, 2020

(87) PCT Pub. No.: WO2019/126995
PCT Pub. Date: Jul. 4, 2019

(65) Prior Publication Data
US 2020/0352055 A1 Nov. 5, 2020

(51) Int. Cl.
*H05K 7/20* (2006.01)
*F25B 39/04* (2006.01)
*F28D 21/00* (2006.01)

(52) U.S. Cl.
CPC ......... *H05K 7/20318* (2013.01); *F25B 39/04* (2013.01); *H05K 7/203* (2013.01);
(Continued)

(58) Field of Classification Search
CPC .... F28B 1/02; F28B 3/06; F25B 39/04; F25B 2339/047; F28D 2021/007; F28D 1/0213;
(Continued)

(56) References Cited

U.S. PATENT DOCUMENTS 1,498,408 A * 6/1924 Stoms .................. F25B 39/04
261/77
1,851,329 A * 3/1932 Replogle ............. F25B 39/04
165/110
(Continued)

FOREIGN PATENT DOCUMENTS

| CN | 101346058 A | 1/2009 |
| CN | 101600918 A | 12/2009 |
| JP | 2004003686 A * | 1/2004 |

OTHER PUBLICATIONS

International Search Report of PCT Patent Application No. PCT/CN2017/118553 dated Aug. 29, 2018.

*Primary Examiner* — Robert J Hoffberg

(57) ABSTRACT

The application relates to a high-efficiency phase-change condenser for a supercomputer, including a condenser box body, a refrigerant input pipe, a refrigerant output pipe and a condensing coil; a liquid refrigerant accommodated in the condenser box body, and a gas-phase region existing between a liquid level of the liquid refrigerant and a top of the condenser box body; one portion of the condensing coil immersed into the liquid refrigerant, and the other portion of the condensing coil located in the gas-phase region above the liquid level of the liquid refrigerant; and in the gas-phase region, refrigerant vapor bubbles are liquified by the condensing coil. Liquid-phase and gas-phase saturated refrigerants can be completely condensed by the condensing coil in a limited condenser space, thereby improving heat exchange efficiency of the condenser.

10 Claims, 1 Drawing Sheet

(52) U.S. Cl.
CPC .... H05K 7/20327 (2013.01); *F25B 2339/047* (2013.01); *F28D 2021/007* (2013.01)

(58) Field of Classification Search
CPC ...... F28D 1/0477; C09K 5/04; F28F 2265/24; G06F 1/20; G06F 2200/201; H05K 7/203; H05K 7/20318; H05K 7/20327; Y02P 20/10

See application file for complete search history.

(56) References Cited

U.S. PATENT DOCUMENTS

| | | | | |
|---|---|---|---|---|
| 2,512,758 | A * | 6/1950 | Stamberger | F25B 43/00 62/218 |
| 3,406,244 | A * | 10/1968 | Sevgin | H01J 7/24 174/15.1 |
| 3,545,228 | A * | 12/1970 | Dinger | F25B 39/04 62/506 |
| 4,249,391 | A * | 2/1981 | Taylor | F28C 1/16 62/304 |
| 7,421,855 | B2 * | 9/2008 | Ring | F28F 9/0265 62/525 |
| 8,170,724 | B2 * | 5/2012 | Kelley | H05K 7/20736 700/299 |
| 9,944,839 | B2 * | 4/2018 | Schultz | C09K 5/045 |
| 10,247,448 | B2 * | 4/2019 | Masaki | F04D 29/058 |
| 10,247,457 | B2 * | 4/2019 | Gu | F25B 43/006 |
| 10,662,583 | B2 * | 5/2020 | Reissner | F26B 23/005 |
| 10,689,315 | B2 * | 6/2020 | Hong | C07C 19/08 |
| 2015/0219874 | A1 * | 8/2015 | Figueredo | G03F 7/7095 359/845 |
| 2016/0312095 | A1 * | 10/2016 | Schultz | C09K 5/045 |
| 2017/0307269 | A1 * | 10/2017 | Gu | F25B 31/00 |

* cited by examiner

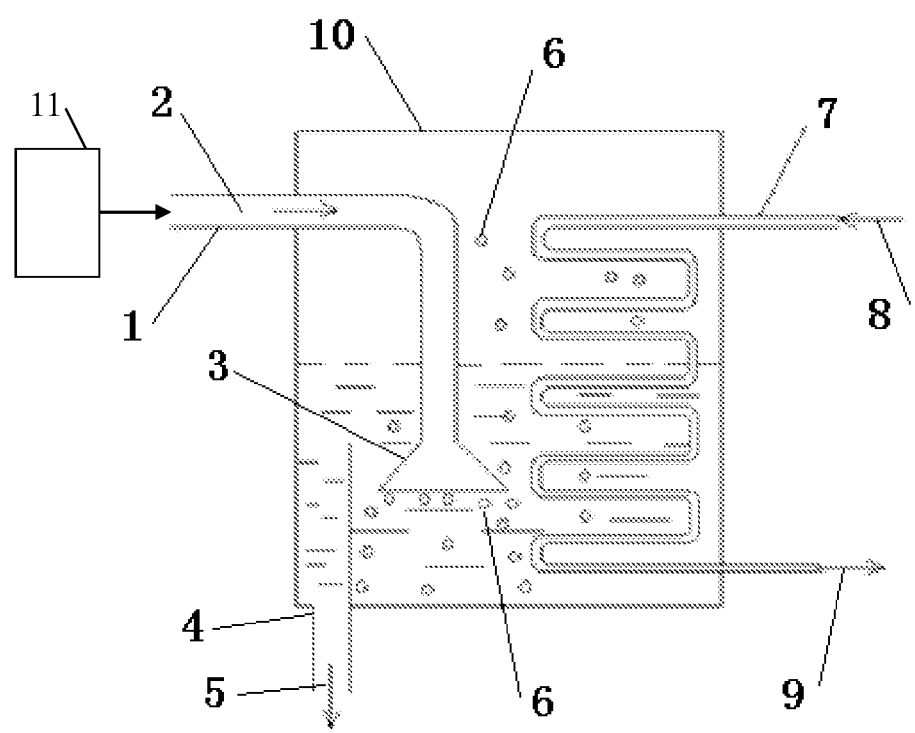

HIGH-EFFICIENCY PHASE-CHANGE CONDENSER OF A SUPERCOMPUTER

FIELD OF THE APPLICATION

The application relates to the field of computer technology, and in particular, to a high-efficiency phase-change condenser of a supercomputer.

BACKGROUND OF THE APPLICATION

Most of computers used currently are cooled by cold air, but in the data center, air cooling alone is not enough to meet the heat dissipation requirements of high-heat-flux servers. The traditional air cooling modes adopt indirect contact cooling. Due to complicated heat transfer process, large sum of contact thermal resistance and convection heat exchange thermal resistance, low heat exchange efficiency and big temperature difference between high and low temperature heat sources in the heat exchange process, a lower outdoor low-temperature heat source is required to guide the heat exchange process.

Liquid cooling is to transfer heat from a hot region to a distant place for cooling by taking a working fluid as an intermediate medium for heat transfer. Since liquid has much larger specific heat and much higher heat-dissipating speed than those of air, the refrigeration efficiency of the liquid cooling is much higher than those of air cooling. Liquid cooling or water cooling have two advantages: 1, the refrigerant is directly led to the heat source instead of indirect cooling like air cooling; and 2, heat transferred per unit volume, that is, the heat dissipation efficiency, is 3500 times that of air cooling.

Evaporative cooling is, based on thermology principle, to take away heat by latent heat of vaporization when the refrigerant is boiling. Since the latent heat of vaporization of liquid is much larger than specific heat, cooling effect of evaporative cooling is more significant.

In a liquid cooling system, a condenser is required to condense vapor of the refrigerant and change the vapor into the liquid refrigerant again for circular cooling. However, shell-and-tube-exchange heaters and finned tube heat exchangers currently on the market cannot meet high refrigerating capacity requirement of the supercomputer in the effective space.

SUMMARY OF THE APPLICATION

For the defects in the prior art, according to an embodiment of the application, a high-efficiency phase-change condenser for a supercomputer is provided, which may completely condense liquid-phase and gas-phase saturated refrigerants by the condensing coil in a limited condenser space, thereby improving heat exchange efficiency of the condenser.

In order to fulfill the aim, according to an embodiment of the application, a high-efficiency phase-change condenser of a supercomputer is provided, comprising: a condenser box body, a refrigerant input pipe, a refrigerant output pipe and a condensing coil; a liquid refrigerant is accommodated in the condenser box body, and a gas-phase region exists between a liquid level of the liquid refrigerant and a top of the condenser box body; a refrigerant vapor outlet at a lower end of the refrigerant input pipe stretches below the liquid level of the liquid refrigerant; a portion of the condensing coil is immersed into the liquid refrigerant, and the other portion of the condensing coil is located in the gas-phase region above the liquid level of the liquid refrigerant; and in the gas-phase region, refrigerant vapor bubbles are liquified by the condensing coil.

According to an embodiment of the application, the refrigerant vapor outlet is trumpet-shaped.

According to an embodiment of the application, the condensing coil is snakelike.

According to an embodiment of the application, the liquid level of the liquid refrigerant is located at half a height of the condensing coil.

According to an embodiment of the application, the liquid refrigerant is an electric insulation liquid refrigerant.

According to an embodiment of the application, the electric insulation liquid refrigerant is an electric insulation liquid refrigerant with a boiling point between 30° C. and 60° C.

According to an embodiment of the application, the electric insulation liquid refrigerant is fluoride.

According to an embodiment of the application, in the condenser, the saturated refrigerant vapor will be broken into small bubbles by the refrigerant liquid, thereby enlarging heat exchange area and improving heat exchange efficiency; furthermore, most of the vapor bubbles will be directly cooled by liquid, heat exchange efficiency between the vapor and the liquid is higher, and the rest of vapor bubbles are cooled by the condensing coil in the gas-phase region. Therefore, the condenser has higher heat exchange efficiency in the limited condenser space.

BRIEF DESCRIPTION OF THE ACCOMPANYING DRAWINGS

FIG. 1 is a schematic structural diagram of a condenser according to an embodiment of the application.

DESCRIPTION OF ACCOMPANYING DRAWING MARKS

1—refrigerant input pipe, 2—saturated refrigerant, 3—refrigerant vapor gas outlet, 4—refrigerant output pipe, 5—refrigerant liquid, 6—vapor bubbles, 7—condensing coil, 8—low-temperature cooling liquid, 9—high-temperature cooling liquid, and 10—condenser.

DETAILED DESCRIPTION OF THE PREFERRED EMBODIMENTS

For clearer descriptions of the objects, technical solutions and advantages in the present application, embodiments of the present application will be described in details with reference to the accompanying drawings. It should be noted that the embodiments of the present application and the characteristics in the embodiments can be combined with other another arbitrarily without conflict.

According to an embodiment of the application, as shown in FIG. 1, a high-efficiency phase-change condenser 10 for a supercomputer 11 is provide, comprising: a condenser box body, a refrigerant input pipe 1, a refrigerant output pipe 4 and a condensing coil 7; a liquid refrigerant accommodated in the condenser box body, and a gas-phase region exists between a liquid level of the liquid refrigerant and a top of the condenser box body; a refrigerant vapor outlet 3 at a lower end of the refrigerant input pipe 1 stretching below the liquid level of the liquid refrigerant; and one portion of the condensing coil 7 immersed into the liquid refrigerant, and the other portion of the condensing coil 7 located in the gas-phase region above the liquid level of the liquid refrigerant. A section of the refrigerant output pipe 4 extends upward from a bottom of the condenser box body and into the condenser box body to a distance above a lowermost end of the refrigerant vapor outlet 3 at the lower end of the refrigerant input pipe 1.

The condenser 10 encapsulates the condensing coil 7 into a closed cavity of the condenser box body which stores refrigerant liquid. Cooling liquid is introduced into the condensing coil 7, and a saturated refrigerant 2 which is heated and boiled by heating elements (electrical elements such as a CPU, a server mainboard, etc.) in a server is dispersed into tiny vapor bubbles 6 at an outlet terminal of the refrigerant vapor outlet 3. Then the tiny vapor bubbles 6 and the refrigerant liquid are mixed, whereby most of the vapor bubbles 6 are cooled into liquid by the refrigerant liquid, and the rest of tiny vapor bubbles 6 ascend to the gas-phase region in an upper portion of the cavity and are in contact with the condensing coil 7 to be cooled into liquid by the condensing coil 7 and flow back to the bottom of the cavity. An upper half part of the condensing coil 7 cools the refrigerant bubbles 6, while the part, of the condensing coil 7 immersed into the refrigerant liquid cools the refrigerant liquid.

The condensing coil 7 comprises a cooling liquid input port and a cooling liquid output port. Low-temperature cooling liquid 8 flows into the condensing coil 7 from the cooling liquid input port and exchanges heat with the refrigerant liquid and the vapor bubbles 6, then high-temperature cooling liquid 9 flows out of the cooling liquid output port. The cold water may be selected as the low-temperature cooling liquid 8.

The saturated refrigerant 2 enters into the condenser 10 where the saturated refrigerant 2 and the vapor bubbles 6 are condensed into refrigerant liquid 5, through the refrigerant input pipe 1. Then the condensed refrigerant liquid 5 flows out of the refrigerant output pipe 4 for recycling. The liquid refrigerant is an electric insulation liquid refrigerant, for example, fluoride. Since the boiling point of the fluoride is between 30° C. and 60° C., heat absorbed from a heating element may be taken out timely by the refrigerant vapor.

The refrigerant vapor outlet 3 is trumpet-shaped.

According to one or more embodiments of the application, the refrigerant vapor outlet 3 is trumpet-shaped.

According to one or more embodiments of the application, the condensing coil 7 is snakelike.

According to one or more embodiments of the application, the liquid level of the liquid refrigerant is located at half a height of the condensing coil 7.

The implementations disclosed by the present application are as above, but the content is only used for understanding the implementations adopted by the present application conveniently, not for limiting the present application. Any modifications and changes in the form and detail of implementation may be made by the skilled in the art, which the application relates to, but without departing from the spirit and scope disclosed by the application, they should be within the protection scope of the present application.

What is claimed is:

1. A high-efficiency phase-change condenser of a supercomputer, comprising:
    a condenser box body;
    a refrigerant input pipe;
    a refrigerant output pipe; and
    a condensing coil,
    wherein a liquid refrigerant is accommodated in the condenser box body, and a gas-phase region exists between a liquid level of the liquid refrigerant and a top of the condenser box body, a refrigerant vapor outlet at a lower end of the refrigerant input pipe stretches below the liquid level of the liquid refrigerant,
    wherein one portion of the condensing coil is immersed into the liquid refrigerant, and another portion of the condensing coil is located in the gas-phase region above the liquid level of the liquid refrigerant,
    wherein refrigerant vapor bubbles are liquified by the condensing coil in the gas-phase region,
    wherein the condensing coil comprises a cooling liquid input port and a cooling liquid output port, a cooling liquid flows into the another portion of the condensing coil from the cooling liquid input port and exchanges heat with the refrigerant vapor bubbles in the gas-phase region, and flows into the one portion of the condensing coil and exchanges heat with the liquid refrigerant in the condenser box body, and then flows out of the cooling liquid output port,
    wherein a section of the refrigerant output pipe extends upward from a bottom of the condenser box body and into the condenser box body to a distance above a lowermost end of the refrigerant vapor outlet at the lower end of the refrigerant input pipe.

2. The high-efficiency phase-change condenser of the supercomputer according to claim 1, wherein the refrigerant vapor outlet is trumpet-shaped.

3. The high-efficiency phase-change condenser of the supercomputer according to claim 2, the condensing coil is snakelike.

4. The high-efficiency phase-change condenser of the supercomputer according to claim 2, wherein the liquid level of the liquid refrigerant is located at half a height of the condensing coil.

5. The high-efficiency phase-change condenser of the supercomputer according to claim 2, wherein the liquid refrigerant is an electric insulation liquid refrigerant.

6. The high-efficiency phase-change condenser of the supercomputer according to claim 1, wherein the condensing coil is snakelike.

7. The high-efficiency phase-change condenser of the supercomputer according to claim 1, wherein the liquid level of the liquid refrigerant is located at half a height of the condensing coil.

8. The high-efficiency phase-change condenser of the supercomputer according to claim 1, wherein the liquid refrigerant is an electric insulation liquid refrigerant.

9. The high-efficiency phase-change condenser of the supercomputer according to claim 8, wherein the electric insulation liquid refrigerant is an electric insulation liquid with a boiling point between 30° C. and 60° C.

10. The high-efficiency phase-change condenser of the supercomputer according to claim 9, wherein the electric insulation liquid refrigerant is fluoride.

* * * * *